(12) United States Patent
Kalman et al.

(10) Patent No.: US 11,677,472 B2
(45) Date of Patent: Jun. 13, 2023

(54) HYBRID INTEGRATION OF MICROLED INTERCONNECTS WITH ICS

(71) Applicants: Robert Kalman, Mountain View, CA (US); Bardia Pezeshki, Mountain View, CA (US); Alexander Tselikov, Mountain View, CA (US); Cameron Danesh, Mountain View, CA (US)

(72) Inventors: Robert Kalman, Mountain View, CA (US); Bardia Pezeshki, Mountain View, CA (US); Alexander Tselikov, Mountain View, CA (US); Cameron Danesh, Mountain View, CA (US)

(73) Assignee: AVICENATECH CORP., Sunnyvale, CA (US)

(*) Notice: Subject to any disclaimer, the term of this patent is extended or adjusted under 35 U.S.C. 154(b) by 0 days.

(21) Appl. No.: 17/461,586

(22) Filed: Aug. 30, 2021

(65) Prior Publication Data

US 2022/0069914 A1    Mar. 3, 2022

Related U.S. Application Data

(60) Provisional application No. 63/072,018, filed on Aug. 28, 2020.

(51) Int. Cl.
| | | |
|---|---|---|
| *H04B 10/00* | (2013.01) | |
| *H04B 10/40* | (2013.01) | |
| *H05K 1/11* | (2006.01) | |
| *G02B 6/42* | (2006.01) | |
| *H04B 10/25* | (2013.01) | |

(52) U.S. Cl.
CPC ........... *H04B 10/40* (2013.01); *G02B 6/4246* (2013.01); *H04B 10/25* (2013.01); *H05K 1/111* (2013.01); *H05K 1/115* (2013.01); *H05K 2201/10121* (2013.01)

(58) Field of Classification Search
CPC ...... H04B 10/40; H04B 10/25; G02B 6/4246; H05K 1/111; H05K 1/115; H05K 2201/10121
See application file for complete search history.

(56) References Cited

U.S. PATENT DOCUMENTS

| | | | |
|---|---|---|---|
| 6,780,661 B1* | 8/2004 | Liu ................. | H01S 5/0262 438/22 |
| 11,054,593 B1* | 7/2021 | Chua ............... | G02B 6/4278 |
| 2004/0159777 A1* | 8/2004 | Stone .............. | G02B 6/4246 250/216 |

(Continued)

OTHER PUBLICATIONS

Peter Kazlas, "Monolithic Vertical-Cavity Laser/p-i-n Photodiode Transceiver Array for Optical Interconnects", Nov. 1998, IEEE Photonics Technology Letters, vol. 10, No. 11, All pages (Year: 1998).*

(Continued)

*Primary Examiner* — Pranesh K Barua
(74) *Attorney, Agent, or Firm* — KOS IP Law LLP

(57) ABSTRACT

For optical communications between semiconductor ICs, optical transceiver assembly subsystems may be integrated with a processor. The optical transceiver assembly subsystems may be monolithically integrated with processor ICs or they may be provided in separate optical transceiver ICs coupled to or attached to the processor ICs.

11 Claims, 11 Drawing Sheets

(56) References Cited

U.S. PATENT DOCUMENTS

| | | |
|---|---|---|
| 2004/0208416 A1 | 10/2004 | Chakravorty et al. |
| 2006/0239605 A1 | 10/2006 | Palen et al. |
| 2011/0278739 A1* | 11/2011 | Lai .................... H01L 23/48 |
| | | 257/E23.141 |
| 2014/0321803 A1 | 10/2014 | Thacker et al. |
| 2016/0216445 A1* | 7/2016 | Thacker ............ G02B 6/4219 |
| 2016/0238793 A1* | 8/2016 | Frankel ................ G02B 6/14 |
| 2017/0288780 A1 | 10/2017 | Yim et al. |
| 2018/0299628 A1 | 10/2018 | Liu et al. |
| 2019/0137706 A1* | 5/2019 | Xie .................... G02B 6/4202 |
| 2019/0287908 A1* | 9/2019 | Dogiamis ........... H01L 23/5385 |
| 2019/0353842 A1 | 11/2019 | Yanagisawa |
| 2020/0158964 A1* | 5/2020 | Winzer ............... G02B 6/4202 |

OTHER PUBLICATIONS

International Search Report on related PCT Application No. PCT/US2021/048270 from International Searching Authority (KIPO) dated Dec. 21, 2021.

Written Opinion on related PCT Application No. PCT/US2021/048270 from International Searching Authority (KIPO) dated Dec. 21, 2021.

* cited by examiner

HYBRID INTEGRATION OF MICROLED INTERCONNECTS WITH ICS

CROSS-REFERENCE TO RELATED APPLICATIONS

This application claims the benefit of U.S. Provisional Patent Application No. 63/072,018, filed on Aug. 28, 2020, the disclosure of which is incorporated by reference herein.

FIELD OF THE INVENTION

This invention relates generally to optical interconnects using microLEDs, and more particularly to integration of optical transceivers using microLEDs and other ICs.

BACKGROUND OF THE INVENTION

The need for high-performance computing and networking is ubiquitous and ever-increasing. Prominent applications include data center servers, high-performance computing clusters, artificial neural networks, and network switches.

For decades, dramatic integrated circuit (IC) performance and cost improvements were driven by shrinking transistor dimensions combined with increasing die sizes, summarized in the famous Moore's Law. Transistor counts in the billions have allowed consolidation of functions that were previously fragmented across multiple ICs onto a single system-on-a-chip (SoC).

However, the benefits of further transistor scaling are decreasing dramatically as decreasing marginal performance benefits combine with decreased yields and increased per-transistor costs. Independent of these limitations, a single IC can only contain so much functionality. Additionally, different functions (e.g., logic, DRAM, I/O) require different process sequences, and thus not all the desired functions can be combined on a single integrated circuit. In fact, there are significant benefits to "de-integrating" SoCs into smaller "chiplets", including: the process for each chiplet can be optimized to its function, e.g., logic, DRAM, high-speed I/O, etc.; chiplets are well-suited for reuse in multiple designs; chiplets are less expensive to design; and chiplets have higher yield because they are smaller with fewer devices.

However, a major drawback to chiplets compared to SoCs is that chiplets require a higher density of inter-chip connections. Compared to the on-chip connections between functional blocks in SoCs, chip-to-chip connections are typically much less dense and require far more power (normalized as energy per bit).

State-of-the-art chip-to-chip interconnects utilize interposers and bridges, where the chips are flip-chip bonded to a substrate that contains the chip-to-chip electrical traces. While such interconnects provide far higher density and far lower power than interconnects of packaged chips via a printed circuit board (PCB), they still fall very far short of what is desired: chip-to-chip interconnects that approach the density and power dissipation of intra-chip interconnects.

The power and maximum reach of electrical interconnects are fundamentally limited by capacitance and conductor resistance. Interconnect density is limited by conductor width and layer count. The capacitance C of short electrical interconnects is proportional to interconnect length and approximately independent of conductor width w (assuming dielectric thickness scales approximately proportionately). The resistance R of electrical connections, and thus the maximum length (limited by RC) is inversely proportional to the conductor cross-sectional area, which scales as $w^2$. The density of electrical connections is inversely proportional to w. Thus, there are trade-offs in interconnect density, length, and power, and these trade-offs are fundamental, being based on dielectric permittivity and conductor (e.g., copper) resistance.

Thus, electrical interconnects have fundamental limitations that constrain system performance and limit what is achievable with so-called "more than Moore" 2.5 D and 3 D advanced packaging.

BRIEF SUMMARY OF THE INVENTION

Optical interconnects, and more specifically 3 D optical interconnects, do not suffer from these limitations.

Some embodiments provide a device including optical communication components, comprising: a processor IC; an optical transceiver subsystem with elements in or attached to an optical transceiver IC, the optical transceiver IC electrically coupled to the processor IC, the optical transceiver subsystem including a plurality of transmitter instances and receiver instances; with each of the transmitter instances including transmitter circuitry in the optical transceiver IC and a microLED, bonded to a top surface of the optical transceiver IC, electrically connected to the transmit circuitry; with each of the receiver instances including receiver circuitry in the optical transceiver IC and a photodetector, in or bonded to a top surface of the optical transceiver IC, electrically connected to the receiver circuitry; and the optical transceiver IC possibly including vias coupling the transmitter circuitry and the receiver circuitry to pads on a bottom surface of the optical transceiver IC, the optical transceiver IC being coupled to the processor IC at least in part by the pads.

In some embodiments the pads are coupled to an interconnect layer of the processor IC. In some embodiments the pads are coupled to an interconnect layer of an interposer to which both the processor IC and the optical transceiver IC are mounted. In some embodiments the processor IC and the optical transceiver IC are both mounted to opposing surfaces of an interposer. In some embodiments the optical transceiver IC is mounted over a hole in an interposer. In some embodiments the pads are coupled to a package substrate to which both the processor IC and the optical transceiver IC are mounted. In some embodiments the photodetectors are monolithically integrated in the receiver circuitry. In some embodiments coupling optics are coupled to the optical transceiver IC. In some embodiments the coupling optics include a turning mirror.

Some embodiments further comprise: a further processor IC; a further optical transceiver subsystem with elements in or attached to a further optical transceiver IC, the further optical transceiver IC coupled to the further processor IC, the further optical transceiver subsystem including a plurality of further transmitter instances and further receiver instances; with each of the further transmitter instances including further transmitter circuitry in the further optical transceiver IC and a further microLED, bonded to a top surface of the further optical transceiver IC, electrically connected to the further transmit circuitry; with each of the further receiver instances including further receiver circuitry in the further optical transceiver IC and a further photodetector, in or bonded to a top surface of the further optical transceiver IC, electrically connected to the further receiver circuitry; the further optical transceiver IC including vias connecting the further transmitter circuitry and the receiver further circuitry to pads on a bottom surface of the further optical transceiver IC, the further optical transceiver IC being coupled to the further processor IC at least in part by the pads; and an optical propagation medium coupling the optical transceiver IC and the further optical transceiver IC. In some such embodiments the optical propagation medium comprises a multicore fiber.

The drive power and density of optical interconnects are approximately independent of the length of the connection. With regards to density, multi-layer planar optical interconnects can achieve densities that are on the same order of the density of electrical interconnects. However, "3D" optical interconnects that are normal to the chip surface, possibly can achieve extraordinary densities that are far beyond what is possible with planar interconnects; densities of >2500 interconnects per $mm^2$ at 4 Gbps data rates are readily achievable, providing a throughput density of >1 $Pbps/cm^2$.

Some embodiments provide optical interconnects. Some embodiments provide 3D optical interconnects. In some embodiments the optical interconnects are between integrated circuit chips. In some embodiments the integrated circuit chips are on a common substrate or interposer. In some embodiments the integrated circuit chips are in a same package. In some embodiments the integrated circuit chips are in a same multi-chip module.

These and other aspects of the invention are more fully comprehended upon review of this disclosure.

DETAILED DESCRIPTION

Figure 1:
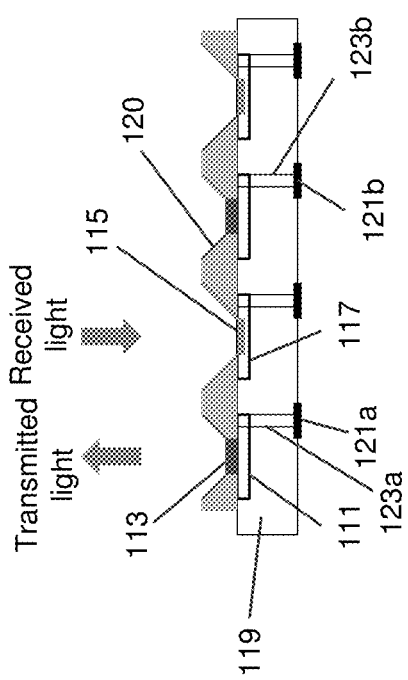
FIG. 1 shows a side cross-sectional view of an optical transceiver array subsystem comprised of multiple transmitter and receiver instances, in accordance with aspects of the invention.

FIG. 1 shows an optical transceiver array subsystem (OTRAS) comprised of multiple transmitter (Tx) and receiver (Rx) instances. The Tx and Rx instances may be laid out in a two-dimensional pattern. In some embodiments, the pattern is a square or a rectangular grid. In some embodiment, the pattern is hexagonal close-packed. The Tx and Rx instances may alternate, as shown in FIG. 1, or they may be laid out in blocks of numerous adjacent transmitters and blocks of numerous adjacent receivers. Only two Tx instances and two Rx instances are shown in FIG. 1, in various embodiments the number of Tx instances and Rx instances may be greater.

Each Tx instance comprises Tx circuitry 111 electrically connected to an optical emitter 113. The Tx circuitry may comprise various amplifier/buffer stages, equalization circuitry to enhance frequency response, and a variety of monitoring and control circuitry. In some embodiments, each Tx instance includes collection optics designed to more efficiently collect and transmit the light from the emitter. The collection optics may comprise reflectors and/or refractive elements such as lenses.

In some embodiments, the optical emitter is a microLED. In some embodiments, the microLED is made in the GaN material system with InGaN quantum wells. In some embodiments, the emitter is bonded to the transmitter circuit using solder, thermal-compression bonding, or by means of Van der Waals forces.

Each Rx instantiation comprises a photodetector 115 electrically connected to receiver circuitry 117. The Rx circuitry comprises a transimpedance amplifier (TIA) and subsequent amplifying stages, where each stage may be a linear amplifier or limiting amplifier. This Rx circuitry can be as simple as a resistor in series with the photodetector, or complex enough to also comprise equalization for enhancing frequency response, clock-and-data recovery, and a variety of other monitoring and control circuitry. In some embodiments, each Rx includes collection optics designed to more efficiently collect the light onto the photodetector. The collection optics may comprise reflectors and/or refractive elements such as lenses.

In some embodiments, the photodetector is monolithically integrated with the Rx circuitry. In some embodiments, the photodetector is bonded to the Rx circuitry using solder, thermal-compression bonding, or by means of Van der Waals forces.

FIG. 1 also shows the optical emitters and photodetectors on or inset in what may be considered a top surface of a substrate 119, for example a silicon substrate, with the optical emitters and photodetectors bounded by reflectors 120. The Tx circuitry and the Rx circuitry are each electrically coupled to pads 121a,b on a bottom surface of the substrate by one or more through-silicon vias 123a,b.

In some embodiments, the OTRAS is contained in an optical transceiver IC (OTRIC).

Figure 2:
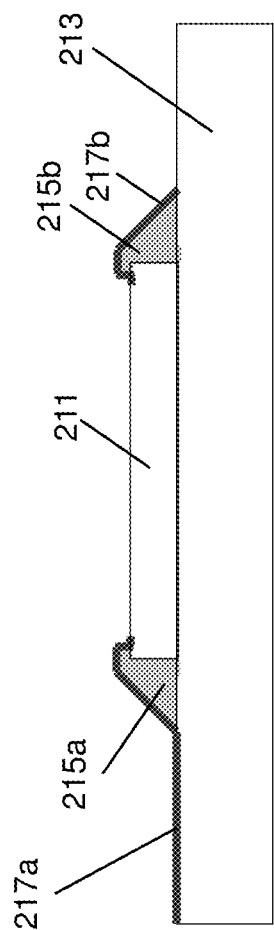
FIG. 2 shows an example of an optical transceiver IC on top of a processor IC, in accordance with aspects of the invention.

In some embodiments the OTRAS comprises the Tx instantiations, the Rx instantiations, and the silicon substrate. In some embodiments the OTRAS is as discussed and/or shown with respect to FIG. 1. In some embodiments, the OTRIC is bonded to a top of a processor IC, or some other IC including logic and/or other circuitry, and electrical connections are made from OTRIC to the processor IC. In some embodiments the electrical connections comprise metal lines that are deposited and patterned such that they run from electrical pads on the OTRIC and down the side of the OTRIC to electrical pads on the processor IC. In some embodiments, an additional layer of an insulating material such as a polymer or phosphosilicate glass (PSG) is deposited and patterned to passivate the sidewalls, to provide electrical insulation and, in some embodiments reduce the steepness of the step from the top surface of the OTRIC to the top surface of the processor IC. FIG. 2 shows an example of an optical transceiver IC 211 on top of a processor IC 213. An insulator 215a,b is shown about opposing sides of the optical transceiver IC, extending from a base on the processor IC to just above a top surface of the optical transceiver IC. The base of the insulator extends away from the optical transceiver IC, with a thickness of the insulator steadily decreasing with distance from the processor IC, to form a sloped sidewall. Metal traces 217a,b run from a top surface of the optical transceiver IC, down the sloped sidewall formed by the insulator, and onto the processor IC.

Figure 3:
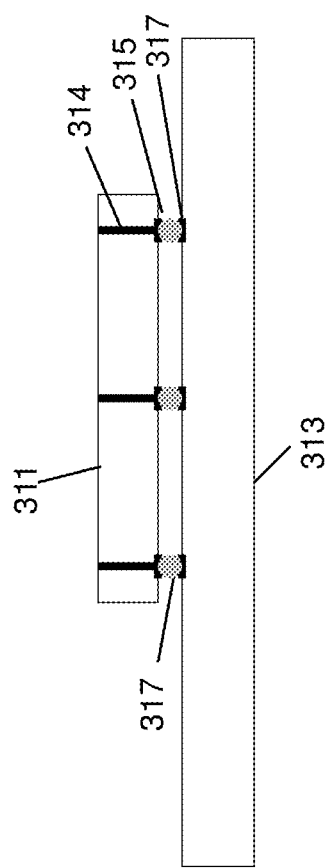
FIG. 3 also shows an optical transceiver IC mounted to a processor IC, in accordance with aspects of the invention.

In some embodiments, the OTRIC includes vias, which may be through-silicon vias (TSVs) in some embodiments, that allow connection from the active circuitry on its top surface to pads on its bottom surface. In some embodiments, the thickness of the OTRIC is in the range of 10 um-100 um. FIG. 3 also shows an OTRIC 311 mounted to a processor IC 313. Vias 314 connect active circuitry on a top surface of the OTRIC to pads 315 on a bottom of the OTRIC. The pads on the bottom of the OTRIC are bonded to pads 317 on top of the processor IC, in some embodiments. In some embodiments, and as shown in FIG. 3, this bonding is via solder bumps 319. In some embodiments, this bonding is via micro-bumps consisting of copper pillars that are capped with a solder layer. In some embodiments, this bonding is via direct thermal-compression bonding of pads on the two ICs.

Figure 4:
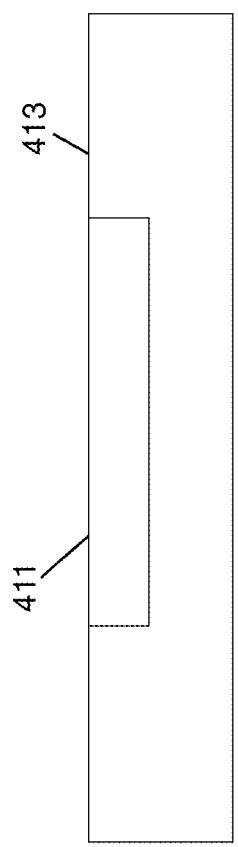
FIG. 4 shows a side cross-sectional view of an optical transceiver array subsystem monolithically integrated with a processor IC, in accordance with aspects of the invention.

Rather than being contained in a separate IC, in some embodiments one or more optical transceiver array subsystems (OTRASs) are monolithically integrated with a processor IC, for example as shown in FIG. 4. In FIG. 4, an OTRAS 411 is shown monolithically integrated with a processor IC 413, with for example the OTRAS about and forming part of a top surface of the processor IC. Photodetectors of the OTRAS can be made in the same process as the other processor IC circuitry (e.g., CMOS), for example using structures such as lateral p-i-n diodes, and the transimpedance amplifiers and microLED drivers can be realized in the same semiconductor process. MicroLEDs can be lifted-off, transferred, and bonded to the OTRAS as previously discussed. In subsequent embodiments discussed below, the OTRAS may either be contained in a separate OTRIC or monolithically integrated into a processor IC.

Figure 5:
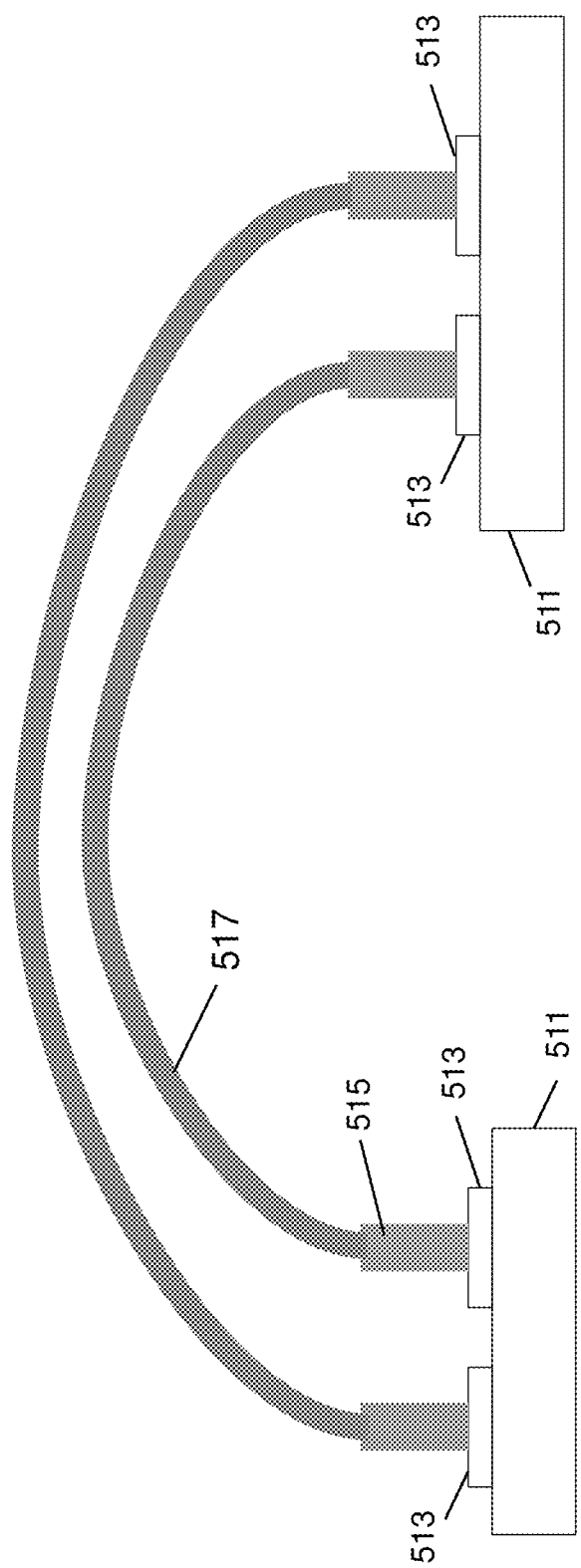
FIG. 5 shows a pair of processor ICs, with each processor IC having a pair of optical transceiver ICs on top of the processor IC, in accordance with aspects of the invention.

In some embodiments parallel optical links are formed by coupling an OTRAS to each end of a propagation medium. The coupled OTRAS may be on separate ICs having logic or other circuitry, and the separate ICs may be processors. The propagation medium provides connectivity such that each Tx is connected to an Rx on the other end of the link. In some embodiments, each OTRAS is butt-coupled to an optical propagation medium, transferring the optical signals from one location to another. In some embodiments, the OTRAS is coupled to an optical propagation medium by coupling optics. FIG. 5 shows a pair of processor ICs 511, with each processor IC having a pair of OTRICs 513 on top of the processor IC. Coupling optics 515 couple each OTRIC to an optical propagation medium 517, with a first optical propagation medium coupling a first OTRIC of each processor IC and a second optical propagation medium coupling a second OTRIC of each processor IC.

Figure 6:
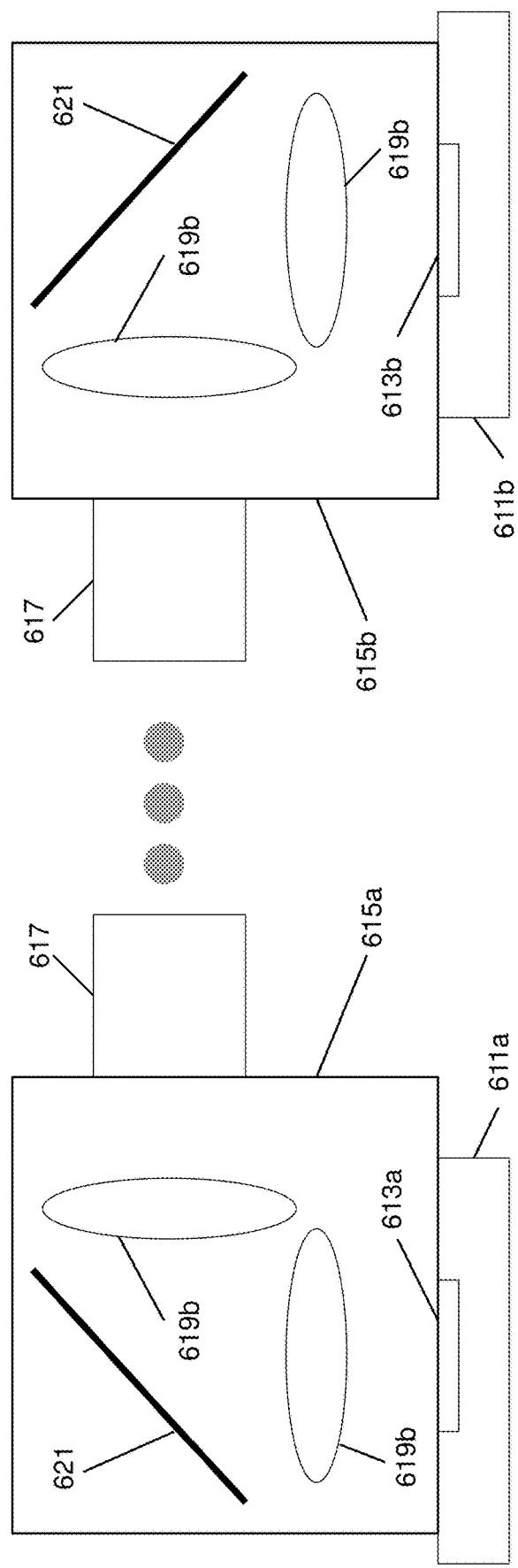
FIG. 6 shows use of turning mirrors to turn light by 90° in coupling light from OTRAS in different digital ICs, in accordance with aspects of the invention.

In some embodiments, the coupling optics comprise multiple lenses and/or turning mirrors that relay the light from the OTRAS to the optical propagation medium. In some embodiments, the coupling optics perform an imaging operation in which the top of the OTRAS is imaged onto the input of the optical propagation medium with some magnification factor, where the magnification may be approximately unity or may be some other value. In some embodiments, more complex optics comprising gratings and/or holograms are used to shuffle the positions of optical channels, to provide fan-in connectivity, and/or to provide fan-out connectivity. FIG. 6 shows use of turning mirrors to turn light by 90° in coupling light from OTRAS in different digital ICs. In FIG. 6, a pair of digital ICs 611a,b each include an OTRAS 613a,b monolithically integrated in the digital ICs. Each OTRAS has associated coupling optics 615a,b, with the coupling optics coupled by an optical propagation medium 617. In each of the coupling optics, a single turning mirror, placed between two lenses, turns light by 90°. As illustrated in FIG. 6, the OTRAS are positioned below their associated coupling optics. The coupling optics includes a first lens 619a, a turning mirror 621, and a second lens 619b. The first lens is positioned between the OTRAS and the turning mirror. The turning mirror is angled at 45° relative to vertical and horizontal planes, so as to redirect light from a vertical direction to a horizontal direction. The second lens is positioned between the turning mirror and the optical propagation medium 617. The optical propagation medium is shown as being to a side of the coupling optics.

Figure 7C:
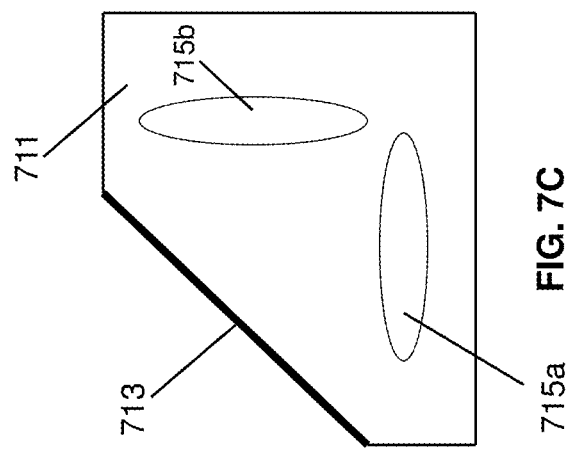
FIG. 7c shows a free space optical propagation medium with lenses and a mirror.

In some embodiments, the optical propagation medium is a multicore fiber, for example where each optoelectronic device (OED) is coupled to a unique fiber core. FIG. 7a illustrates a cross-section of a multicore fiber, which has a plurality of waveguides 711 surrounded by cladding 713 along their length. In some embodiments each optoelectronic device is part of a Tx instantiation or part of an Rx instantiation, for example as discussed with respect to FIG. 1. In some embodiments, the optical propagation medium is a coherent fiber bundle (CFB) where each OED is coupled to multiple fiber cores. In some embodiments, the CFB fiber core diameters are in the range of 3 um to 10 um. In some embodiments, CFB may contain from 1000 to 10000 fiber cores.

In some embodiments, the propagation medium contains optical waveguides formed in a transparent bulk solid, e.g., silica glass, borosilicate glass, or a polymer. In this case, each OED is coupled to a unique optical waveguide.

Figure 7B:
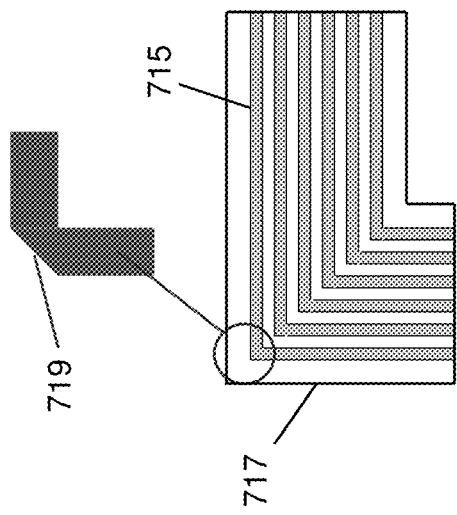
FIG. 7b shows an optical propagation medium comprised of layers of planar optical waveguides.
Figure 7A:
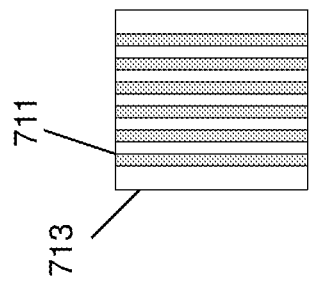
FIG. 7a illustrates a cross-section of a multicore fiber, which has a plurality of waveguides 711 surrounded by cladding 713 along their length.

In some embodiments, the optical propagation medium comprises one or more layers of planar optical waveguides, for example as shown in FIG. 7b. In FIG. 7b, a plurality of planar waveguides 715 are each surrounded along their length by cladding 717, with each of the waveguides including a right angle bend. A turning mirror 719 in each waveguide turns the light at a right angle at the right angle bend so that light may propagate down the waveguide.

In some embodiments, the optical propagation medium comprises free space or a bulk solid, e.g., silica-based glass. Free-space optical elements such as lenses, mirrors, and holograms may be included in the propagation medium. These elements are intended to direct the light between the optical input and optical output of the propagation medium. FIG. 7c shows a free space optical propagation medium 711 with lenses and a mirror 713. The mirror is angled at 45° degrees relative to vertical and horizontal planes, with a first lens 715*a* generally in a horizontal plane below the mirror, and a second lens 715*b* generally in a vertical plane to a side of the mirror, such that light passing through either lens, and towards the mirror, is generally directed towards the other lens.

Various of the embodiments discussed above can be incorporated into packaged multi-chip modules. These multichip modules (MCMs) may comprise one or more processor ICs attached to an interposer via solder bumps. The interposer is attached to a package substrate via solder bumps. In some embodiments, the interposer is made from silicon and has electrical RDL layers on its surface. In some embodiments, the interposer is made from an organic material. The connection between the surfaces of the interposer substrate can be made using through-substrate vias (TSVs). In some embodiments, there is no interposer and the ICs are directly attached to the package substrate.

Figure 8:
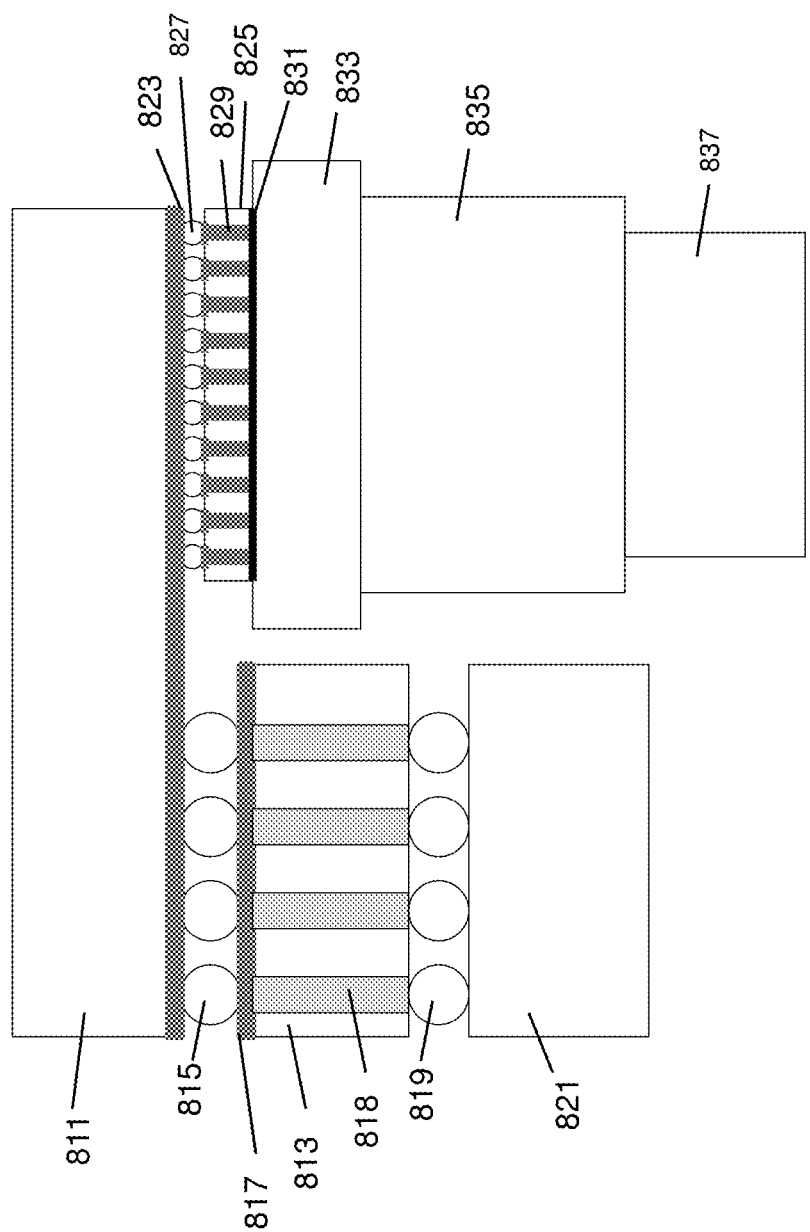
FIG. 8 shows a side cross-sectional view including portions of a multichip module with an optical transceiver IC attached to a processor IC using micro-bumps, in accordance with aspects of the invention.

In some embodiments of an MCM, one or more OTRICs are attached to the processor IC with micro-bumps, for example as illustrated in FIG. 8. In FIG. 8, a processor IC 811 is mounted to an interposer 813 using solder bumps 815. The interposer includes an interconnect layer 817, which may be in the form of a redistribution layer, shown as being on a side of the interposer facing the processor IC, and a plurality of through substrate vias (TSVs) 828. Solder bumps 819 electrically connect the interposer to a package wall 821 of the MCM. In some embodiments, a surface of the processor IC, facing the interposer, includes an interconnect layer 823. An optical transceiver IC (OTRIC) 825 is attached to the processor IC, on the side facing the interposer, by microbumps 827. TSVs 829 connect from the "back" side of the OTRIC, facing the processor IC, to the OTRIC's "top" side, away from the processor IC, that contains active circuitry, and to which optical emitters are attached, with FIG. 8 showing together circuitry and optoelectronic devices 831 on the "top" side of the OTRIC. In some embodiments, the emitters are GaN microLEDs. In some embodiments, an optical assembly is attached to the "top" of each OTRIC, where the optical assembly comprises an optical coupling mount 833, an optical coupling assembly (including coupling optics 835), and a multicore fiber 837. In FIG. 8, the OTRIC is shown as mounted to the processor IC at a position at which the interposer and/or package wall allow for passage of the optical coupling mount, coupling optics, and multicore fiber through or past the interposer and/or package wall. In some embodiments, the optical coupling mount is attached to each OTRIC prior to attaching the OTRIC to the processor IC, and the optical coupling assembly and multicore fiber are then attached after the OTRIC is attached to the processor IC. In some embodiments, the optical coupling assembly and optical coupling mount form a connector that can be mated and de-mated multiple times. In some embodiments, the optical coupling assembly and optical coupling mount form a connector that can be mated just once and then permanently fixed in place.

Figure 9:
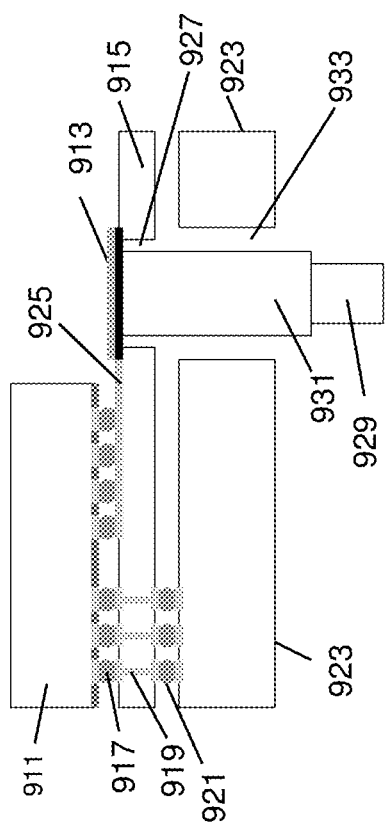
FIG. 9 shows an example of a processor IC 911 and an optical transceiver IC mounted to a top surface of an interposer, in accordance with aspects of the invention.

In some embodiments of an MCM, the active side of one or more OTRICs and one or more processor ICs are mounted to the top surface of an interposer. FIG. 9 shows an example of a processor IC 911 and OTRIC 913 mounted to a top surface of an interposer 915. As with the embodiment of FIG. 8, in FIG. 9 solder bumps 917 are shown as connecting the processor IC to the interposer, with TSVs 919 of the interposer coupled to solder bumps 921 electrically coupling the interposer to a package wall 923. The interposer is also shown as having an interconnect layer 925 from solder bumps of the processor IC to the OTRIC. Electrical connections from each OTRIC to the interposer can be made with solder bumps, micro-bumps, or direct thermal-compression bonds. The active side of each OTRIC includes PDs and microLED emitters. A hole 927 in the interposer enables coupling of these PDs and microLEDs to a multicore fiber 929 via coupling optics 931 that are attached to each OTRIC. The fiber exits via a hole 933 in the package.

Figure 10:
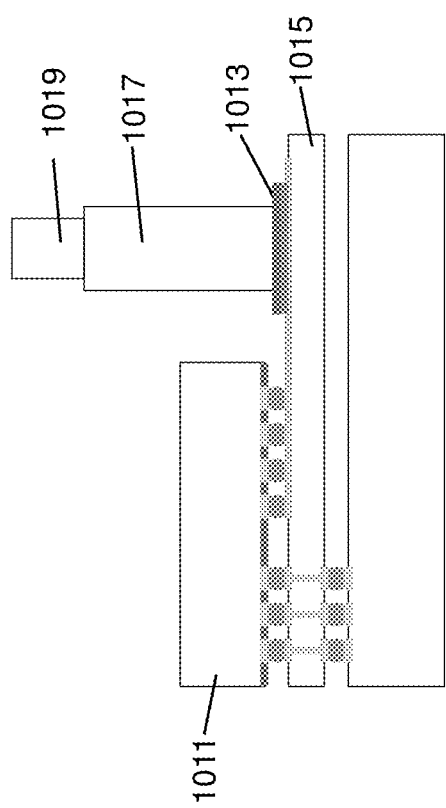
FIG. 10 shows a processor IC and an optical transceiver IC mounted to a top side of an interposer, with coupling optics and a multicore fiber extending away from a side of the optical transceiver IC away from the interposer, in accordance with aspects of the invention.

In some embodiments of an MCM, the "bottom" (non-active) side of one or more OTRICs is mounted to the top surface of an interposer, to which one or more processor ICs mounted also mounted. FIG. 10 shows a processor IC 1011 and an OTRIC 1013 mounted to a top side of an interposer 1015, with coupling optics 1017 and a multicore fiber 1019 extending away from a side of the OTRIC away from the interposer. Electrical connections from the OTRIC to the interposer are made with solder bumps, micro-bumps, or direct thermal-compression bonds. The two interposer surfaces are connected by through-substrate vias. The bottom side of each OTRIC is electrically connected to the active top side by vias. The active side of each OTRIC includes PDs and microLED emitters. The PDs and emitters are coupled to the multicore fiber by the optical coupling assembly that is attached to each OTRIC. In some embodiments of an MCM, there is no interposer and the "bottom" side of one or more OTRICs is mounted to the top surface of a package substrate, to which one or more processor ICs mounted also mounted.

Figure 11:
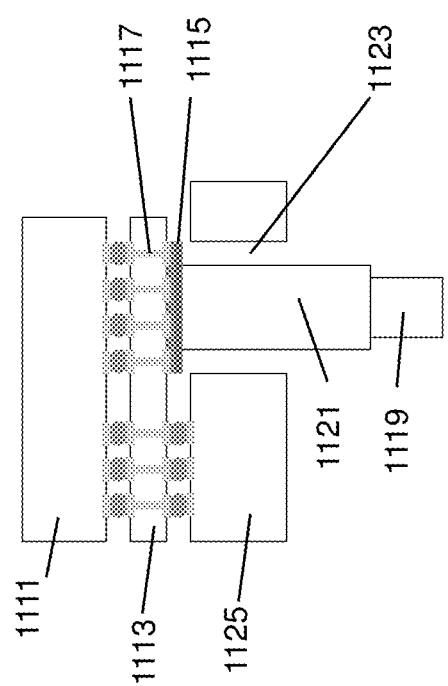
FIG. 11 shows a processor IC mounted to one side of an interposer and an optical transceiver IC mounted to an opposing side of the interposer, in accordance with aspects of the invention.

In some embodiments of an MCM, the "bottom" (non-active) side of one or more OTRICs is mounted to the bottom surface of an interposer; the top surface of the interposer has one or more processor ICs mounted to it. FIG. 11 shows a processor IC 1111 mounted to one side of an interposer 1113, and an OTRIC 1115 mounted to an opposing side of the interposer. Electrical connections from each OTRIC to the interposer are made with solder bumps, micro-bumps, or direct thermal-compression bonds. The two interposer surfaces are connected by through-substrate vias 1117. The bottom side of each OTRIC is electrically connected to the active top side by vias. The active side of each OTRIC includes PDs and microLED emitters. The PDs and emitters are coupled to a multicore fiber 1119 by an optical coupling assembly 1121 that is attached to each OTRIC. The fiber exits via a hole 1123 in the package 1125.

Although the invention has been discussed with respect to various embodiments, it should be recognized that the invention comprises the novel and non-obvious claims supported by this disclosure.

What is claimed is:

1. A device including optical communication components, comprising:
   a processor integrated circuit;
   an optical transceiver subsystem with elements in or attached to an optical transceiver integrated circuit, the optical transceiver integrated circuit electrically coupled to the processor integrated circuit, the optical transceiver subsystem including a plurality of transmitters and receivers;
   with each of the transmitters including transmitter circuitry in the optical transceiver integrated circuit and a microLED, bonded to a top surface of the optical transceiver integrated circuit, electrically connected to the transmitter circuitry;
   with each of the receivers including receiver circuitry in the optical transceiver integrated circuit and a photodetector, in or bonded to the top surface of the optical transceiver integrated circuit, electrically connected to the receiver circuitry; and the optical transceiver integrated circuit including vias coupling the transmitter circuitry and the receiver circuitry to pads on a bottom surface of the optical transceiver integrated circuit, the optical transceiver integrated circuit being coupled to the processor integrated circuit at least in part by the pads.

2. The device of claim 1, wherein the pads are coupled to an interconnect layer of the processor integrated circuit.

3. The device of claim 1, wherein the pads are coupled to an interconnect layer of an interposer to which both the processor integrated circuit and the optical transceiver integrated circuit are mounted.

4. The device of claim 1, wherein the pads are coupled to a package substrate to which both the processor integrated circuit and the optical transceiver integrated circuit are mounted.

5. The device of claim 1, wherein the processor integrated circuit and the optical transceiver integrated circuit are both mounted to opposing surfaces of an interposer.

6. The device of claim 1, wherein the optical transceiver integrated circuit is mounted over a hole in an interposer.

7. The device of claim 1, wherein the photodetectors are monolithically integrated in the receiver circuitry.

8. The device of claim 1, wherein coupling optics are coupled to the optical transceiver integrated circuit.

9. The device of claim 8, wherein the coupling optics include a turning mirror.

10. The device of claim 1, further comprising:
a further processor integrated circuit;
a further optical transceiver subsystem with elements in or attached to a further optical transceiver integrated circuit, the further optical transceiver integrated circuit coupled to the further processor integrated circuit, the further optical transceiver subsystem including a plurality of further transmitters and further receivers;

with each of the further transmitters including further transmitter circuitry in the further optical transceiver integrated circuit and a further microLED, bonded to a top surface of the further optical transceiver integrated circuit, electrically connected to the further transmit circuitry;

with each of the further receivers including further receiver circuitry in the further optical transceiver integrated circuit and a further photodetector, in or bonded to a top surface of the further optical transceiver integrated circuit, electrically connected to the further receiver circuitry;

the further optical transceiver integrated circuit including vias connecting the further transmitter circuitry and the receiver further circuitry to pads on a bottom surface of the further optical transceiver integrated circuit, the further optical transceiver integrated circuit being coupled to the further processor integrated circuit at least in part by the pads; and an optical propagation medium coupling the optical transceiver integrated circuit and the further optical transceiver integrated circuit.

11. The device of claim 10, wherein the optical propagation medium comprises a multicore fiber.

* * * * *